United States Patent [19]
Park et al.

[11] Patent Number: 5,384,735
[45] Date of Patent: Jan. 24, 1995

[54] DATA OUTPUT BUFFER OF A SEMICONDUCTOR MEMORY DEVICE

[75] Inventors: Churoo Park; Yun-Ho Choi, both of Suwon, Rep. of Korea

[73] Assignee: SamSung Electronics Co., Ltd., Suwon, Rep. of Korea

[21] Appl. No.: 130,131

[22] Filed: Oct. 4, 1993

[30] Foreign Application Priority Data

Oct. 2, 1992 [KR] Rep. of Korea ............... 1992/18132

[51] Int. Cl.⁶ ............................................. G11C 7/00
[52] U.S. Cl. ........................... 365/189.05; 365/194; 365/230.06; 365/233
[58] Field of Search ................ 365/194, 189.05, 233, 365/189.01, 193, 230.06

[56] References Cited

U.S. PATENT DOCUMENTS 4,661,928  4/1987  Yasuoka ..................... 365/189.05
4,663,741  5/1987  Reinschmidt et al. ......... 365/189.05

*Primary Examiner*—Joseph A. Popek
*Attorney, Agent, or Firm*—Cushman Darby & Cushman

[57] ABSTRACT

A semiconductor memory device using a clock of a constant period supplied from the exterior of a memory chip and a sense amplifier for reading out data from a memory cell designated by an address includes at least two different delay circuits for setting at least two delay time periods from the clock, a selecting circuit for receiving signals generated from the delay circuits and selecting one of said signals by a given control signal, and a data output buffer for receiving the data generated from the sense amplifier by a signal generated from the selecting circuit.

8 Claims, 3 Drawing Sheets

DATA OUTPUT BUFFER OF A SEMICONDUCTOR MEMORY DEVICE

BACKGROUND OF THE INVENTION

1. Field of the Invention

The present invention relates to semiconductor memory devices, and more particularly, to a data output buffer of a semiconductor memory device using a clock of a constant period applied from an external source.

2. Background of the Related Art

A dynamic RAM (random access memory), which is representative of a read/write memory in a semiconductor memory device, performs data read and write operations subsequent to receipt of a row address strobe signal from the exterior of the memory chip.

A data output operation of a conventional dynamic RAM will now be described with reference to FIGS. 1A and 1B. A row address RA is entered after an inverse row address strobe signal $\overline{RAS}$ is enabled to logic "low" state. After the inverse row address strobe signal $\overline{RAS}$ enters to an active cycle, inverse column address strobe signal $\overline{CAS}$ is enabled to logic "low" state, a column address CA is entered. Data stored memory cell designated by a corresponding address is sensed through a sense amplifier and then generated through a data output buffer. In this data output buffer, a data path is cut off or connected by an output enable signal $\overline{OE}$. As is well known, the output enable signal $\overline{OE}$ is generated using a control clock supplied by a central processing unit memory external to the memory chip and a signal relating to a data sensing state within the memory chip.

In a typical semiconductor memory device such as a dynamic RAM, a time "t" to generate output data after the inverse row address strobe signal $\overline{RAS}$ is enabled is nearly constant. Similarly, a time t to generate the output data after the inverse column address strobe signal $\overline{CAS}$ is enabled is nearly constant. This is because after the row address RA and the column address CA are entered, processes for sensing the data from the designated memory cell and generating the output data are executed sequentially in repetitive manner each time.

As part of this repetitive process, the output enable signal $\overline{OE}$ enables the data output buffer time t after the inverse row address stroke $\overline{RAS}$ in order to generate correct output data through the data output buffer. In a synchronous dynamic RAM, since the output enable signal $\overline{OE}$ is enabled a time t after the inverse column address strobe signal $\overline{CAS}$ is enabled, incorrect output data due to enabling the data output buffer at a undesired time does not occur. Thus, in a conventional semiconductor memory device which does not use a system clock, a determination of the timing output enable signal $\overline{OE}$ should consider the time needed to generate developed data through a sense amplifier to an input side of the data output buffer in order for the data output buffer to operate at a desired time on the data being input.

As is well known, the operating frequency of semiconductor memory devices is slower than the operating frequency of a typical central processing unit. In a high-performance dynamic RAM that achieves high speed operation (or the reduction of a data access time), it is desirable to control read and write operations by synchronizing with a clock supplied from the central processing unit. In these semiconductor memory devices (hereinafter, referred to as synchronous memory devices), since the timing of the data output is synchronized with multiple pulse periods of the system clock, the data output buffer should be enabled in consideration of the time t. For example, when a system clock of 66 MHz among the system clocks ranging from 33 MHz to 100 MHz is supplied from the central processing unit if it is constructed such that the data output buffer is enabled at a rising edge of a second pulse of the system clock which occurs after the inverse column address strobe signal $\overline{CAS}$ is enabled (i.e. after the falling edge), the data output buffer is enabled after 15 ns (nano seconds) corresponding to a first period.

On the other hand, when the system clock of 100 MHz is supplied, if it is constructed such that the data output buffer is enabled at the rising edge of at least a third pulse of the system clock which occurs after the inverse column address strobe signal $\overline{CAS}$ is enabled, the data output buffer is enabled after 20 ns corresponding to a second period. If the time needed to generate data to the input side of the data output buffer after the inverse column address strobe signal $\overline{CAS}$ is enabled is 25 ns, if the system clock of 66 MHz is supplied, the data output buffer is enabled before the data is generated to the input side thereof, thereby generating erroneous output data.

SUMMARY OF THE INVENTION

It is therefore an object of the present invention to provide a data output buffer which is capable of performing a stable data output operation in a semiconductor memory device for many different system clock frequency bands.

It is another object of the present invention to provide a semiconductor memory device having a data output buffer control device and a data output buffer that perform a stable data output operation for many different system clock frequency bands.

In accordance with one aspect of the present invention, a semiconductor memory device using a clock of a constant period supplied from the exterior of a memory chip includes at least two delay circuits for setting at least two delay time periods from the clock, a selecting circuit for receiving signals generated from the delay circuits and selecting one of the signals by a given control signal, and a data output buffer for controlling the transfer of output data by a signal generated from the selecting circuit.

BRIEF DESCRIPTION OF THE DRAWINGS

The above and other objects, advantages and features of the present invention will become more apparent from the following detailed description taken with the attached drawings in which.

DETAILED DESCRIPTION OF THE PREFERRED EMBODIMENT

Figure 2A:
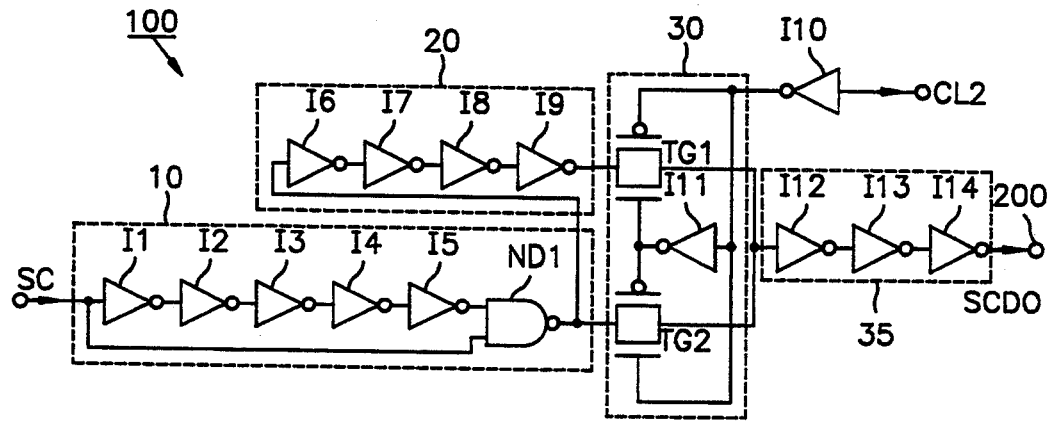
FIG. 2A is a circuit diagram of a control circuit for generating a data output buffer control signal according to the present invention.

Referring to FIG. 2A, a pulse shaping circuit 10 receives a system clock SC applied from an external source. A first delay circuit 20 delays for a given time the output of the pulse shaping circuit 10. A selecting circuit 30 selectively transfers one of the outputs of the pulse shaping circuit 10 and the first delay circuit 20 through transfer gates TG1 and TG2, respectively, the selection of the output being controlled by a column address combination signal CL2. A second delay circuit 35 delays the output of the selecting circuit 30 for a given time and generates a data output buffer control signal SCDO supplied to a data output buffer shown in FIG. 2B.

The signal applied to the pulse shaping circuit 10 may use the system clock, or an internal clock having a constant period derived from system clock. The column address combination signal CL2 is a "latency" signal representing that output data is generated when a rising edge of a second pulse of the system clock elapses after the inverse column address strobe signal $\overline{CAS}$ is enabled. Thus, a distinction between a latency of "2" ("high" state of CL2 and latency of "3" ("low" state of CL2) can be made.

Figure 1B:
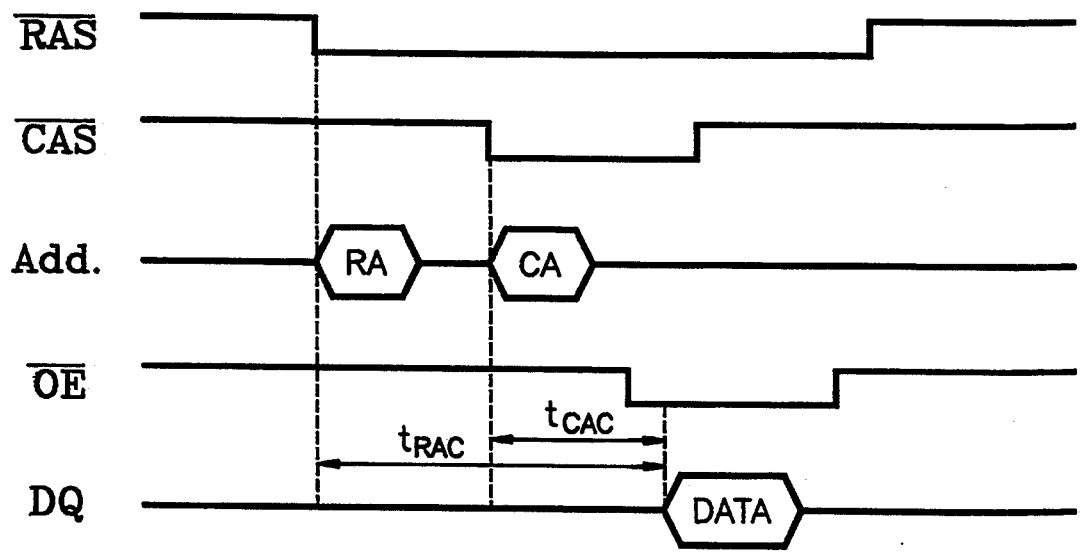
FIG. 1B is a timing diagram illustrating the data output operation of a conventional dynamic RAM.
Figure 1A:
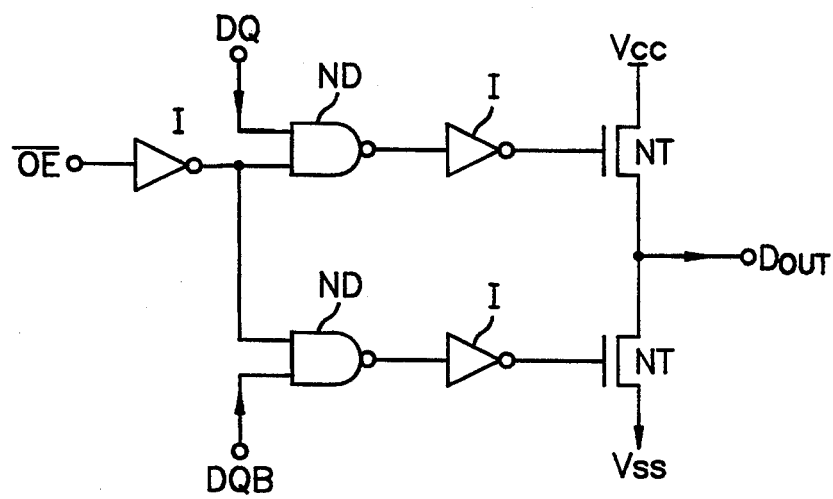
FIG. 1A is a circuit diagram of a data output buffer of a conventional dynamic RAM.
Figure 2B:
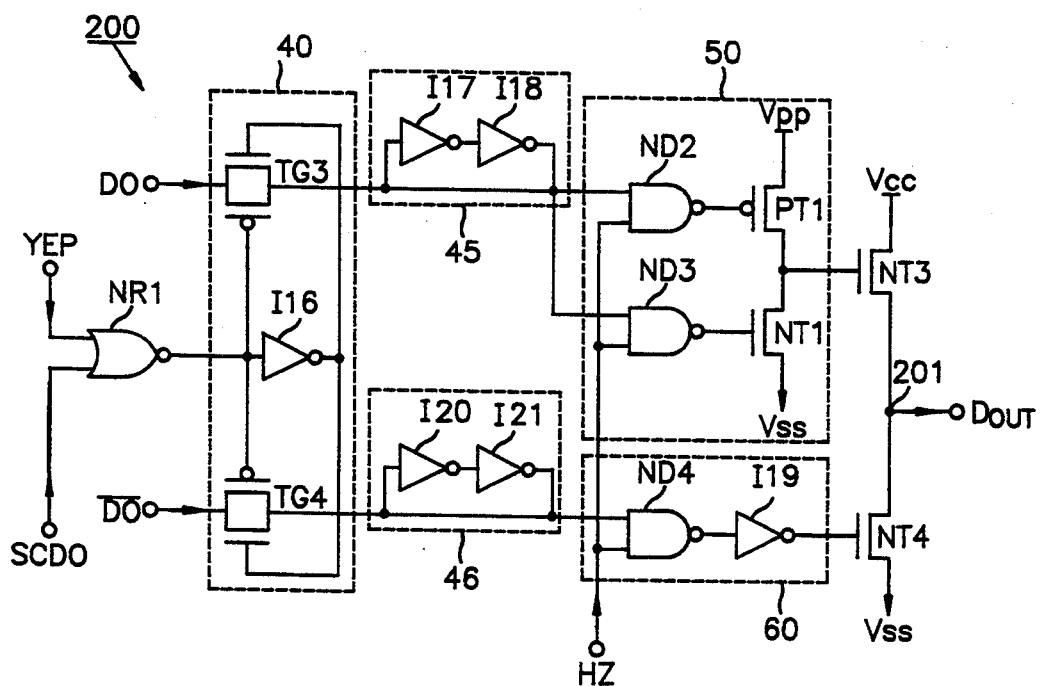
FIG. 2B is a circuit diagram of a data output buffer according to the present invention.

Referring to FIG. 2B, the data output buffer control signal SCDO is applied to the data output buffer together with a latency information signal YEP. The latency information signal YEP is a signal for notifying the data output buffer that, after an address is entered, the output data will be generated by synchronizing with the rising edge of a corresponding pulse of the system clock after the inverse column address strobe signal $\overline{CAS}$ is enabled. Moreover, the latency information signal YEP is in logic "low" state except for the case corresponding to the rising edge of a first pulse (or the starting point of a first period) of the system clock. The output of a NOR gate NR1 receiving the latency information signal YEP and data output buffer control signal SCDO controls a data input circuit 40 which includes transfer gates TG3 and TG4, which respectively receive data signals DO and $\overline{DO}$ generated from a sense amplifier (not shown). The outputs of the transfer gates TG3 and TG4 of the data input circuit 40 are temporarily stored in latch circuits 45 and 46 and then transferred to drivers 50 and 60 for driving the data signals DO and $\overline{DO}$, respectively. A pull-up transistor PT1 of the driver 50 provides a supply voltage and uses a voltage Vpp, generated in the semiconductor memory device, to sufficiently supply a full power voltage Vcc through pull-up transistor NT3 to a data output node 201 by raising a gate voltage of the pull-up transistor NT3. A driver control signal HZ for controlling the signal transfer of the drivers 50 and 60 has the same function as that of the output enable signal $\overline{OE}$ applied to a conventional data output buffer shown in FIG. 1B.

Figure 3:
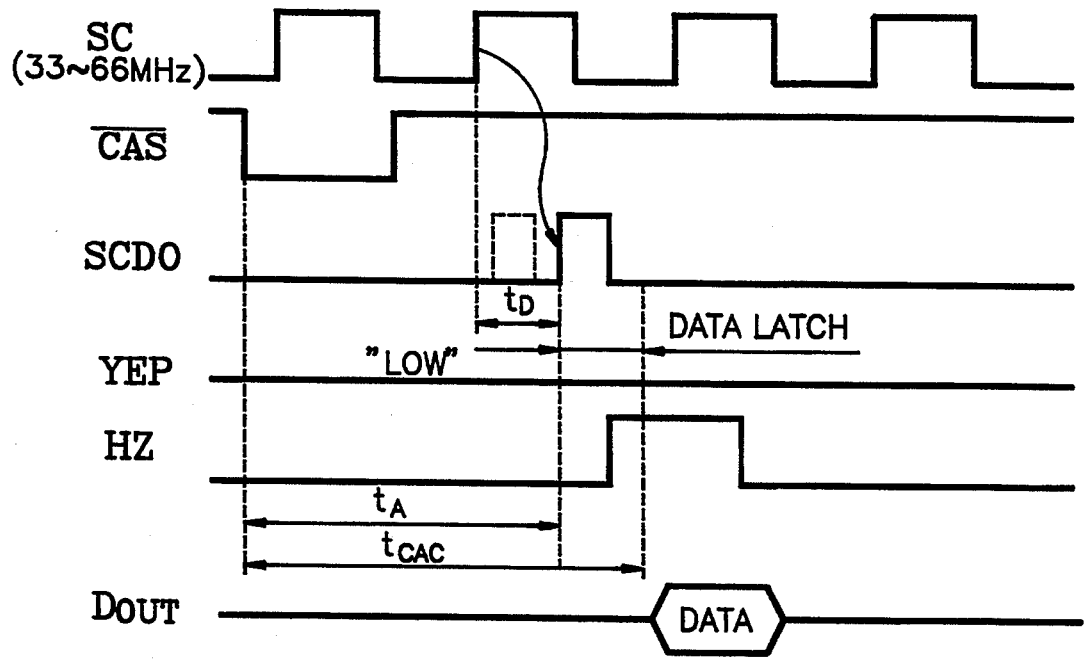
FIG. 3 is a timing chart illustrating a data output state when a data output buffer control signal of FIG. 2A is generated through a first path.

FIG. 3 illustrates a data output control state when the column address combination signal CL2 of FIG. 2A is logic "high" state in which the latency is "2" and the frequency band of the system clock SC is 33–66 MHz. The transfer gate TG1 of FIG. 2A is turned on by the column address combination signal CL2 of logic "high" state and the data output buffer control signal SCDO is generated through the pulse shaping circuit 10, first delay circuit 20, transfer gate TG1 and second delay circuit 35. Therefore, after the inverse column address strobe signal $\overline{CAS}$ is enabled to logic "low" state, the data output buffer control signal SCDO is enabled to logic "high" state when a given delay time $t_D$ caused by the first and second delay circuits 20 and 30 elapses after the rising edge of a second pulse of the system clock (or after a first period of the system clock SC). In the case that the column address combination signal CL2 is logic "high" state indicating that the latency is "2", because the latency information signal YEP is logic "low" state, the output of the NOR gate NR1 shown in FIG. 2B changes to logic "low" state by the data output buffer control signal SCDO of logic "high" state. Since the data output buffer control signal SCDO of logic "high" state has a short pulse width determined by the pulse shaping circuit 10, the transfer gates TG3 and TG4 of the data input circuit 40 are not conducting for an extended time period. Hence, the data signals DO and $\overline{DO}$ supplied from the sense amplifier are respectively supplied to the latch circuits 45 and 46 and temporarily stored. Thereafter the driver control signal HZ is enabled to logic "high" state and output data $D_{out}$ is generated. A pulse of logic "high" state indicated by a dotted line in waveform the SCDO of FIG. 3 illustrates the result of using circuits not constructed in accordance with the present invention as shown in FIGS. 2A and 2B (that is, the first delay circuit 20 is not provided). It is apparent that if a time $T_A$ needed to generate the data output buffer control signal SCDO is about 30 ns, the data output buffer can be properly driven wing the present invention but cannot be properly driven with the prior art.

Figure 4:
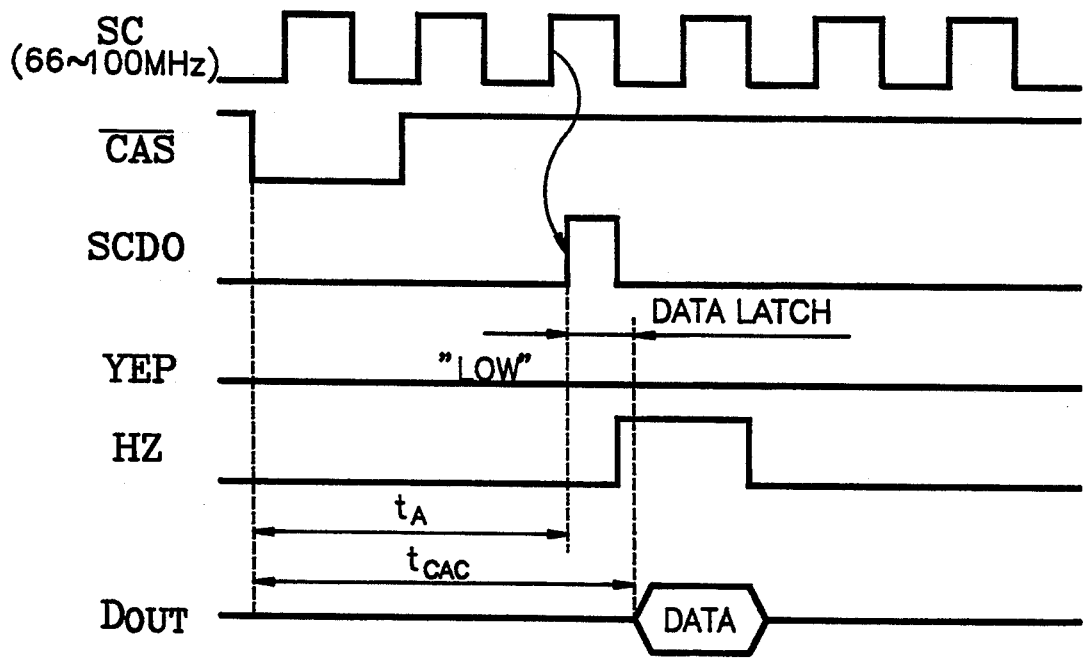
FIG. 4 is a timing chart illustrating a data output state when a data output buffer control signal of FIG. 2A is generated through a second path.

FIG. 4 illustrates a data output control state when the column address combination signal CL2 of FIG. 2A is logic "low" state, i.e., the latency is "3" and the frequency band of the system clock SC is 66–100 MHz. In this case, since only the transfer gate TG2 is turned on, the data output buffer control signal SCDO is transferred through the pulse shaping circuit 10, transfer gate TG2 and second delay circuit 35, and enabled to logic "high" state of a short pulse when the rising edge of a third pulse of the system clock SC (or after a second period of the system clock SC) elapses after the inverse column address strobe signal $\overline{CAS}$ is enabled. Since the latency information signal YEP is logic "low" state, the data input circuit 40 of the data output buffer of FIG. 2B is enabled by the data output buffer control signal SCDO of logic "high" state. The next operations in the data output buffer are the same as those of FIG. 3. As shown in FIG. 4, if the latency is "3" and the system clock SC having the frequency band of 100 MHz is applied, since the time $T_A$ to generate the data output buffer control signal SCDO is about 30 ns, the data output buffer can be driven according to the time $T_A$ of 30 ns even though the system clock SC is not delayed through the first delay circuit 20.

As seen from the foregoing, the control circuit for generating the data output buffer control signal SCDO can control the data output buffer according to a time needed to generate the data to the input side of the data output buffer after the inverse column address strobe signal $\overline{CAS}$ is enabled, regardless of the frequency band of the system clock. Therefore if the semiconductor memory device uses a system clock of a constant period, since the desired output data can be generated irrespective of the system clock frequency band supplied from the central processing unit, the reliability of the data output operation can be improved.

While there is shown and described the preferred embodiment of the invention, it will be understood by those skilled in the art that foregoing and other changes in form and details may be made without departing from the spirit and scope of the present invention.

What is claimed is:

1. A semiconductor memory device data output circuit using an externally supplied clock of a constant period comprising:
    a delay circuit which outputs different first and second delayed signals from said clock having first and second delay time periods;
    a selecting circuit for receiving said first and second delayed signals generated from said delay circuit and selecting one of said first and second delayed signals according to a predetermined control signal; and
    a data output buffer for outputting data in response to said selected delayed signal from said selecting circuit and a latency information signal.

2. The semiconductor memory device data output circuit according to claim 1, wherein said predetermined control signal is derived from the combination of addresses.

3. The claim 1, wherein said selected delayed signal from said selecting circuit is synchronized with said externally supplied clock.

4. A control circuit for a semiconductor memory device receiving an externally supplied clock of a constant period and an address strobe signal and having a data output buffer, comprising:

signal generating means for generating a signal for controlling data output to said data buffer in response to said clock and a latency information signal said signal generating means including at least two delay means for setting at least two different delay time periods from said clock; and
    selecting means for receiving signals generated from said delay means and selecting one of said signals by a given control signal.

5. The semiconductor memory device as claimed in claim 4, wherein said given control signal is derived from the combination of addresses.

6. The semiconductor memory device as claimed in claim 4, wherein said signal selected by said selecting means is synchronized with said clock.

7. A semiconductor memory device receiving a clock of a constant period supplied from the exterior of a semiconductor memory chip and having a sense amplifier for reading out data from a memory cell designated by an address, comprising: at least two delay means, each delay means setting a different delay time period from said clock and delaying said clock; selecting means for receiving signals generated from said delay means and selecting one of said signals by a given control signal; and a data output buffer for receiving the data generated from said sense amplifier in response a signal generated from said selecting means and a latency information signal.

8. The semiconductor memory device as claimed in claim 7, wherein said data output buffer further includes a latch circuit for temporarily storing data received by a signal generated from said selecting means.

* * * * *